(12) United States Patent
Terasaki

(10) Patent No.: US 11,177,186 B2
(45) Date of Patent: Nov. 16, 2021

(54) BONDED BODY AND INSULATED CIRCUIT BOARD

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/755,934

(22) PCT Filed: Oct. 25, 2018

(86) PCT No.: PCT/JP2018/039674
§ 371 (c)(1),
(2) Date: Apr. 14, 2020

(87) PCT Pub. No.: WO2019/082970
PCT Pub. Date: May 2, 2019

(65) Prior Publication Data
US 2020/0243409 A1 Jul. 30, 2020

(30) Foreign Application Priority Data

Oct. 27, 2017 (JP) .............................. JP2017-208374
Oct. 23, 2018 (JP) .............................. JP2018-199139

(51) Int. Cl.
*H01L 23/15* (2006.01)
*H01L 23/498* (2006.01)
(Continued)

(52) U.S. Cl.
CPC .......... *H01L 23/15* (2013.01); *H01L 21/4846* (2013.01); *H01L 23/367* (2013.01);
(Continued)

(58) Field of Classification Search
CPC . H01L 23/15; H01L 23/367; H01L 23/49866; H01L 23/3735; H01L 23/473;
(Continued)

(56) References Cited

U.S. PATENT DOCUMENTS 6,440,590 B1 * 8/2002 Nomura .................... H05K 3/38
428/698
2012/0281362 A1 * 11/2012 Ishimine ................. H01L 23/15
361/707

(Continued)

FOREIGN PATENT DOCUMENTS

CN 105027277 A 11/2015
CN 105190869 A 12/2015
(Continued)

OTHER PUBLICATIONS

Machine Translation of Abe (JP2012136378A) provided with Office Action (dated Year: 2012).*

(Continued)

*Primary Examiner* — Roshn K Varghese
(74) *Attorney, Agent, or Firm* — Locke Lord LLP; James E. Armstrong, IV; Nicholas J. DiCeglie, Jr.

(57) ABSTRACT

A bonded body is formed by bonding a ceramic member formed of an Al-based ceramic and a copper member formed of copper or a copper alloy, in which, in a bonding layer formed between the ceramic member and the copper member, a crystalline active metal compound layer formed of a compound including an active metal is formed on a ceramic member side, and, the Al concentration is 0.15 at % or less in a thickness range of 0.5 µm to 3 µm from an interface of the active metal compound layer on a copper member side toward the copper member.

7 Claims, 9 Drawing Sheets

(51) Int. Cl.
  *H01L 21/48* (2006.01)
  *H01L 23/367* (2006.01)
  *H01L 23/00* (2006.01)

(52) U.S. Cl.
  CPC ........ *H01L 23/49866* (2013.01); *H01L 24/83* (2013.01); *H01L 24/32* (2013.01); *H01L 2224/32225* (2013.01)

(58) Field of Classification Search
  CPC ......... H01L 24/83; H01L 24/32; H01L 24/29; H01L 21/4846; H01L 2224/32225; H01L 2224/83192; H01L 2224/29111; H01L 2224/83101; H01L 2924/13055; H01L 2924/0132; H01L 2924/0133; H01L 2924/29111; H01L 2924/01322; H01L 25/07; H01L 25/18; H05K 1/18; H05K 1/181; H05K 1/092; H05K 1/0201; H05K 3/103; H05K 2201/10378; B23K 20/02; B23K 20/023; B23K 20/2333; B23K 2103/10; B23K 2103/12; B23K 1/0016; B23K 35/302; C04B 37/026; C04B 2237/124; C04B 2237/343; C04B 2237/366; C04B 2237/368; C04B 2237/402; C04B 2237/704; C04B 2237/706; C04B 2237/708; C04B 2237/127; C04B 2237/122; C04B 2237/121; C04B 2237/126; C04B 2237/128; C04B 2237/407; C04B 2237/60; C04B 2237/72; C04B 2235/656; C04B 2235/6567; Y10T 29/49155
  See application file for complete search history.

(56) References Cited

U.S. PATENT DOCUMENTS

| | | | | |
|---|---|---|---|---|
| 2014/0268589 | A1* | 9/2014 | Nakamura | H01L 23/15 |
| | | | | 361/748 |
| 2016/0002110 | A1* | 1/2016 | Izumi | C04B 35/45 |
| | | | | 428/332 |
| 2016/0276244 | A1* | 9/2016 | Terasaki | B23K 35/0244 |
| 2019/0150298 | A1* | 5/2019 | Kishimoto | H01L 23/498 |
| | | | | 174/252 |

FOREIGN PATENT DOCUMENTS

| | | | | | |
|---|---|---|---|---|---|
| CN | 105393348 A | | 3/2016 | | |
| EP | 743131 A1 | * | 11/1996 | | |
| EP | 3121157 A1 | * | 1/2017 | ............ | H01L 23/15 |
| JP | 04-162756 A | | 6/1992 | | |
| JP | 06-032669 A | | 2/1994 | | |
| JP | 2000-016878 A | | 1/2000 | | |
| JP | 2004-311650 A | | 11/2004 | | |
| JP | 2010-215465 A | | 9/2010 | | |
| JP | 2012136378 A | * | 7/2012 | | |
| JP | 2015-224151 A | | 12/2015 | | |
| JP | 5871081 B2 | | 3/2016 | | |
| JP | 2016-058706 A | | 4/2016 | | |
| WO | WO-2015122446 A1 | * | 8/2015 | ........... | C04B 37/025 |

OTHER PUBLICATIONS

Machine Translation of WO2015122446 provided with Office Acion (dated Year: 2015).*
International Search Report dated Jan. 8, 2019, issued for PCT/JP2018/039674 and English translation thereof.
Office Action issued in Chinese Patent Application No. CN 201880067110.6, dated Sep. 14, 2021.

* cited by examiner

BONDED BODY AND INSULATED CIRCUIT BOARD

TECHNICAL FIELD

The present invention relates to a bonded body, which is formed by bonding a ceramic member and a copper member, and an insulated circuit board provided with the bonded body.

This application claims the priority of Japanese Patent Application No. 2017-208374 filed in Japan on Oct. 27, 2017 and Japanese Patent Application No. 2018-199139 filed in Japan on Oct. 23, 2018, the contents of which are incorporated herein.

BACKGROUND ART

Semiconductor devices such as LEDs or power modules have a structure in which a semiconductor element is bonded on a circuit layer formed of a conductive material.

Power semiconductor elements for controlling large amounts of power used for controlling wind power generation, electric vehicles, hybrid vehicles, and the like generate large amounts of heat and therefore, insulated circuit boards, which are, for example, provided with a ceramic substrate formed of AlN (aluminum nitride), $Al_2O_3$ (alumina), or the like and a circuit layer formed by bonding a metal plate with excellent conductivity to one surface of the ceramic substrate, are widely used in the related art as substrates on which the power semiconductor elements are mounted. As substrates for power modules, substrates in which a metal plate is bonded to the other surface of a ceramic substrate to form a metal layer are also provided.

In the related art, as a method of bonding a copper sheet to a ceramic substrate, for example, there is known a so-called DBC method (Direct Bonding Copper method) in which a copper sheet is heated to 1000° C. or higher in an $N_2$ atmosphere in a state of being stacked on a ceramic substrate while applying a load thereto (for example, refer to Patent Document 1).

Here, since the bonding was performed by heating at 1000° C. or higher in a case where the ceramic substrate and the copper sheet were bonded by the DBC method shown in Patent Document 1, there was a concern that the bonding reliability between the ceramic substrate and the copper sheet may be decreased due to the thermal load applied to the ceramic substrate.

Patent Document 2 proposes a bonded body (insulated circuit board) in which an active metal compound region formed of a compound such as an oxide or nitride of an active metal such as Ti is formed on the ceramic member side of a bonding portion formed between a ceramic member and a copper member, and the Al concentration in the bonding portion is in a range of 0.5 at % or more and 15 at % or less in a range with a thickness of 0.5 µm to 3 µm from one surface forming the copper member side of the active metal compound region toward the copper member side.

In this bonded body (insulated circuit board), setting the Al concentration in the bonding portion in a predetermined range obtains a configuration with which it is possible to maintain a high bonding strength between the ceramic member and the bonding portion and in which the peeling rate at the bonding portion is reduced so as to firmly bond the ceramic member and the copper member.

CITATION LIST

Patent Literature

[Patent Document 1]
  Japanese Unexamined Patent Application, First Publication No. H04-162756
[Patent Document 2]
  Japanese Patent No. 5871081

SUMMARY OF INVENTION

Technical Problem

Here, in the circuit layer of the insulated circuit board described above, a terminal material may be bonded with ultrasonic waves.

Here, as described in Patent Document 2, a bonding portion where the Al concentration is in the range of 0.5 at % or more and 15 at % or less is relatively fragile, and therefore, there is a concern that cracks may occur when ultrasonic waves are applied thereto.

In addition, in a case where the active metal compound region formed on the ceramic member side is amorphous, there is a concern that cracks may be generated with the amorphous active metal compound layer as a starting point when ultrasonic waves are applied thereto and that the circuit layer may peel off.

The present invention was created in view of the circumstances described above and has an object of providing a bonded body which is able to suppress peeling between a ceramic member and a copper member even in a case where bonding with ultrasonic waves is performed, and an insulated circuit board.

Solution to Problem

In order to solve the problem described above, a bonded body of the present invention is formed by bonding a ceramic member formed of an Al-based ceramic and a copper member formed of copper or a copper alloy, in which, in a bonding layer formed between the ceramic member and the copper member, a crystalline active metal compound layer formed of a compound including an active metal is formed on a ceramic member side, and, an Al concentration is 0.15 at % or less in a thickness range of 0.5 µm to 3 µm from an interface on a copper member side of the active metal compound layer toward the copper member.

In the bonded body with this configuration, since a crystalline active metal compound layer formed of a compound including an active metal is formed on the ceramic member side of a bonding layer formed between the ceramic member and the copper member, it is possible to suppress the generation of cracks starting from the active metal compound layer and to suppress peeling of the ceramic member and the copper member even in a case where ultrasonic waves are applied thereto.

In addition, since the Al concentration in the bonding layer is suppressed to 0.15 at % or less in a range of a thickness of 0.5 µm to 3 µm from an interface of the active metal compound layer with the copper member toward the copper member, it is possible to suppress the generation of cracks in the bonding layer even in a case where ultrasonic waves are applied thereto.

Here, in the bonded body of the present invention, a thickness of the active metal compound layer is preferably in a range of 1.5 nm or more and 150 nm or less.

According to the bonded body with this configuration, since the thickness of the active metal compound layer is set to be in a range of 1.5 nm or more and 150 nm or less, the active metal compound layer with an appropriate thickness is present at the bonded interface, it is possible to suppress the occurrence of cracking when subjected to a thermal cycle, and the thermal cycle reliability is excellent.

In addition, in the bonded body of the present invention, the ceramic member is preferably formed of one of AlN or $Al_2O_3$.

According to the bonded body with this configuration, selecting one of AlN or $Al_2O_3$ as the ceramic member makes it possible to manufacture a bonded body excellent in insulation and heat resistance.

Furthermore, in the bonded body of the present invention, the active metal compound layer preferably contains one of an active metal nitride and an active metal oxide.

According to the bonded body with this configuration, since the active metal compound layer includes one of an active metal nitride or an active metal oxide, the bonding property between the ceramic member and the copper member is improved and it is possible to further suppress peeling of the ceramic member and the copper member when ultrasonic waves are applied thereto.

An insulated circuit board of the present invention is provided with the bonded body described above, the insulated circuit board including a ceramic substrate, which is formed of the ceramic member, and a circuit layer, which is formed of the copper member formed on one surface of the ceramic substrate.

According to the insulated circuit board with this configuration, since a ceramic substrate, which is formed of the ceramic member, and a circuit layer, which is formed of the copper member formed on one surface of the ceramic substrate, are provided as the bonded body described above, it is possible to suppress the generation of cracks at the bonding portion between the ceramic substrate and the circuit layer and to suppress peeling between the circuit layer and the ceramic substrate even in a case where bonding with ultrasonic waves is applied to the circuit layer.

Here, in the insulated circuit board of the present invention, a metal layer is preferably formed on a surface of the ceramic substrate on a side opposite to the circuit layer.

In such a case, it is possible to efficiently dissipate heat on the circuit layer side through the metal layer formed on the surface of the ceramic substrate on the side opposite to the circuit layer. In addition, it is possible to suppress the generation of warpage of the ceramic substrate.

In addition, in the insulated circuit board of the present invention, the metal layer may be formed of copper or a copper alloy.

In such a case, since a metal layer formed of copper or a copper alloy is formed on the surface of the ceramic substrate on a side opposite to the circuit layer, it is possible to realize an insulated circuit board having excellent heat dissipation.

In addition, in the insulated circuit board according to the present invention, the metal layer may be formed of aluminum or an aluminum alloy.

In such a case, when thermal stress is applied to the ceramic substrate due to a metal layer formed of aluminum or an aluminum alloy having low deformation resistance being bonded to the surface of the ceramic substrate on a side opposite to the circuit layer, it is possible to absorb this thermal stress with the metal layer formed of aluminum or an aluminum alloy and it is possible to suppress breakage of the ceramic substrate due to thermal stress.

Advantageous Effects of Invention

According to the present invention, it is possible to provide a bonded body which is able to suppress peeling of a ceramic member and a copper member even in a case where bonding with ultrasonic waves is performed, and an insulated circuit board.

DESCRIPTION OF EMBODIMENTS

Figure 1:
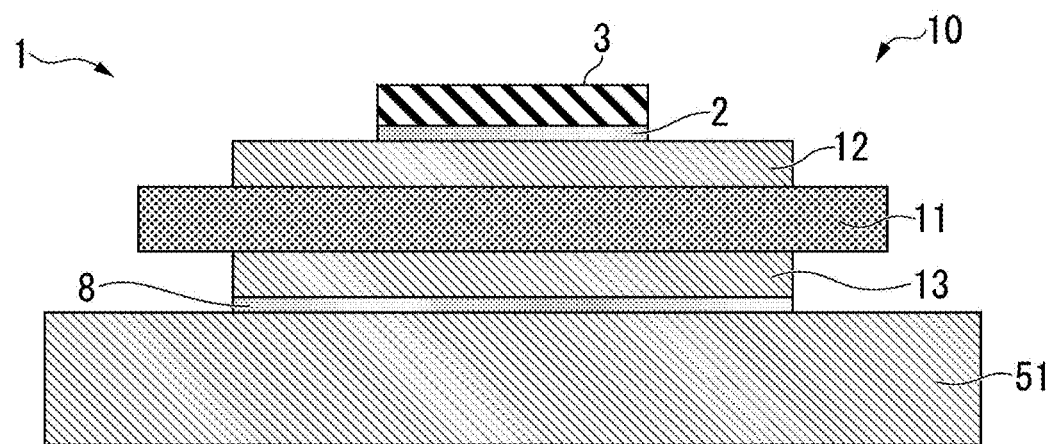
FIG. 1 is a schematic explanatory view of a power module using an insulated circuit board (bonded body) which is a first embodiment of the present invention.

A description will be given below of a bonded body and an insulated circuit board which are embodiments of the present invention with reference to the accompanying drawings. Here, each embodiment shown below is specifically described in order to facilitate understanding of the gist of the invention, and does not limit the invention unless otherwise specified. In addition, for convenience, in the drawings used in the following description, portions which are main parts may be enlarged and the dimensional ratios of each constituent component may not be the same as in practice, in order to make the features of the present invention easy to understand.

First Embodiment

A description will be given below of a first embodiment of the present invention with reference to FIG. 1 to FIG. 4.

The bonded body according to the first embodiment of the present invention is an insulated circuit board 10 configured by bonding a ceramic substrate 11 as a ceramic member formed of Al-based ceramics and a copper sheet 22 (circuit layer 12) as a copper member formed of copper or a copper alloy. Here, the Al-based ceramics refer to ceramics formed of a compound including an Al element such as aluminum oxide or aluminum nitride.

FIG. 1 shows the insulated circuit board 10 which is an embodiment of the present invention and a power module 1 using the insulated circuit board.

The power module 1 is provided with the insulated circuit board 10, a semiconductor element 3 bonded via a first solder layer 2 to one side (upper side in FIG. 1) of the insulated circuit board 10, and a heat sink 51 arranged via a second solder layer 8 on the other side (the lower side in FIG. 1) of the insulated circuit board 10.

Here, the first solder layer 2 and the second solder layer 8 are, for example, Sn—Ag based, Sn—In based, or Sn—Ag—Cu based solder material.

As shown in FIG. 1, the insulated circuit board 10 is provided with a ceramic substrate 11, a circuit layer 12 disposed on one surface (the upper surface in FIG. 1) of the ceramic substrate 11, and a metal layer 13 disposed on the other surface (the lower surface in FIG. 1) of the ceramic substrate 11.

The ceramic substrate 11 is formed of an Al-based ceramic, for example, aluminum nitride (AlN), alumina ($Al_2O_3$), or the like. Here, aluminum nitride (AlN), alumina ($Al_2O_3$), and the like may be reinforced by $ZrO_2$ and the like.

In the present embodiment, the ceramic substrate 11 is formed of aluminum nitride (AlN) having excellent heat dissipation. The thickness of the ceramic substrate 11 is set, for example, in the range of 0.2 to 1.5 mm and, in the present embodiment, 0.635 mm is used.

Figure 4:
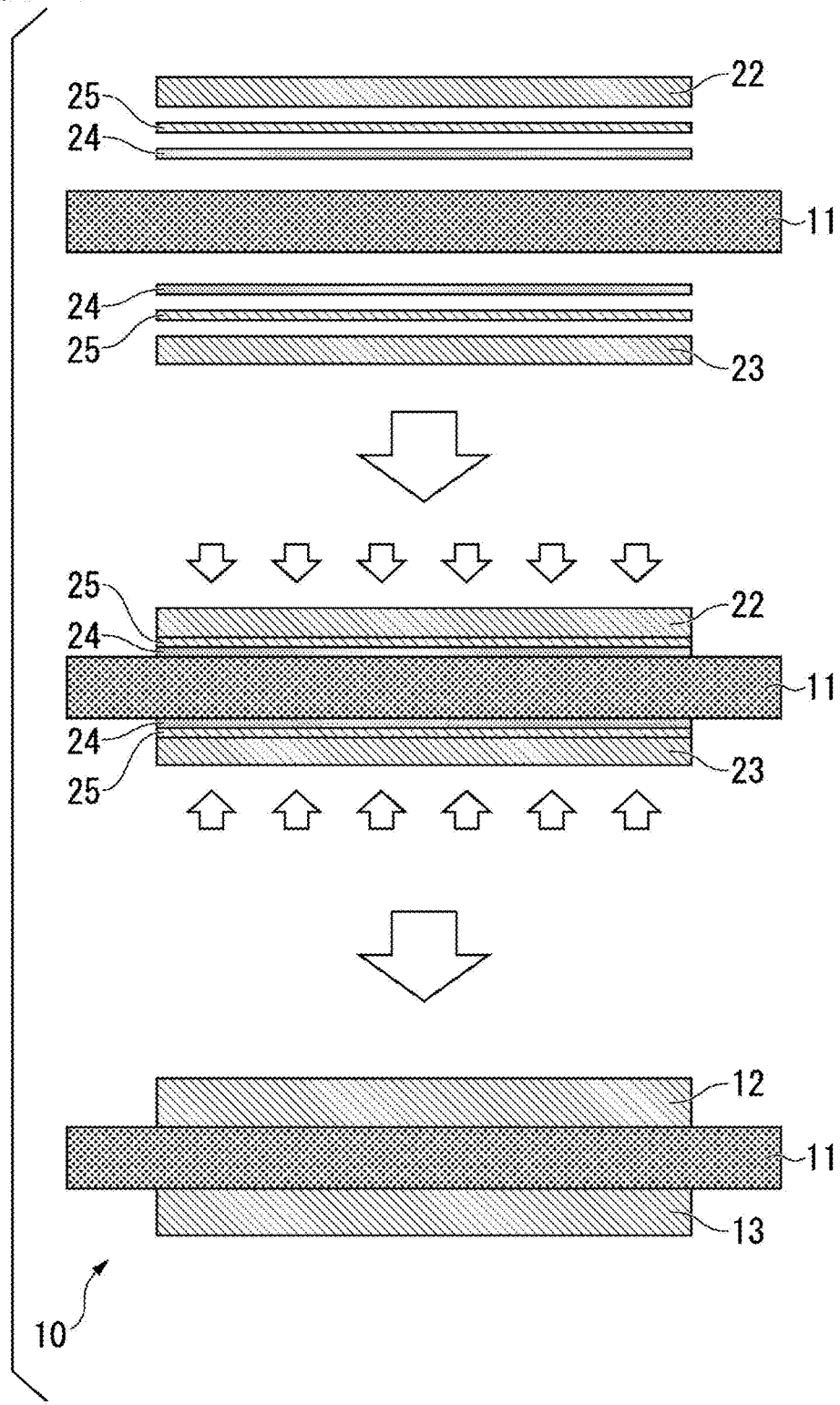
FIG. 4 is an explanatory view showing a method for manufacturing an insulated circuit board (bonded body) which is the first embodiment of the present invention.

The circuit layer 12 is formed by bonding a copper sheet 22 formed of copper or a copper alloy to one surface of the ceramic substrate 11 as shown in FIG. 4. In the present embodiment, a rolled plate of oxygen-free copper is used as the copper sheet 22 forming the circuit layer 12. A circuit pattern is formed on the circuit layer 12 and one surface thereof (the upper surface in FIG. 1) is a mounting surface on which the semiconductor element 3 is mounted. Here, the thickness of the circuit layer 12 (copper sheet 22) is set to be in a range of 0.1 mm or more and 1.0 mm or less, and is set to be 0.6 mm in the present embodiment.

As shown in FIG. 4, the metal layer 13 is formed by bonding a copper sheet 23 formed of copper or a copper alloy to the other surface of the ceramic substrate 11. In the present embodiment, a rolled plate of oxygen-free copper is used as the copper sheet 23 forming the metal layer 13. Here, the thickness of the metal layer 13 (the copper sheet 23) is set to be in a range of 0.1 mm or more and 1.0 mm or less, and is set to be 0.6 mm in the present embodiment.

The heat sink 51 is for cooling the insulated circuit board 10 described above and is a heat dissipating plate in the present embodiment. The heat sink 51 is desirably formed of a material having good thermal conductivity and is formed of A6063 (aluminum alloy) in the present embodiment.

In the present embodiment, the heat sink 51 is bonded via the second solder layer 8 to the metal layer 13 of the insulated circuit board 10.

Figure 2:
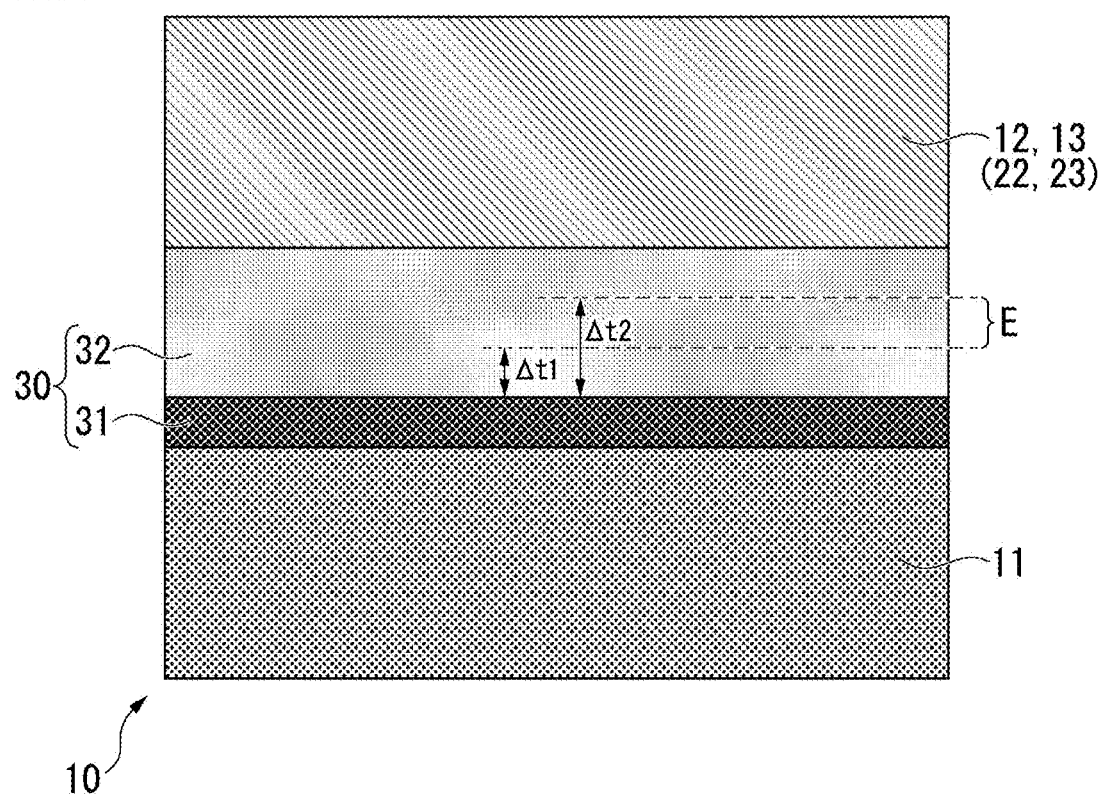
FIG. 2 is a schematic view of a bonded interface between a circuit layer and a metal layer (copper member) and a ceramic substrate (ceramic member) of the insulated circuit board (bonded body) which is the first embodiment of the present invention.
Figure 3:
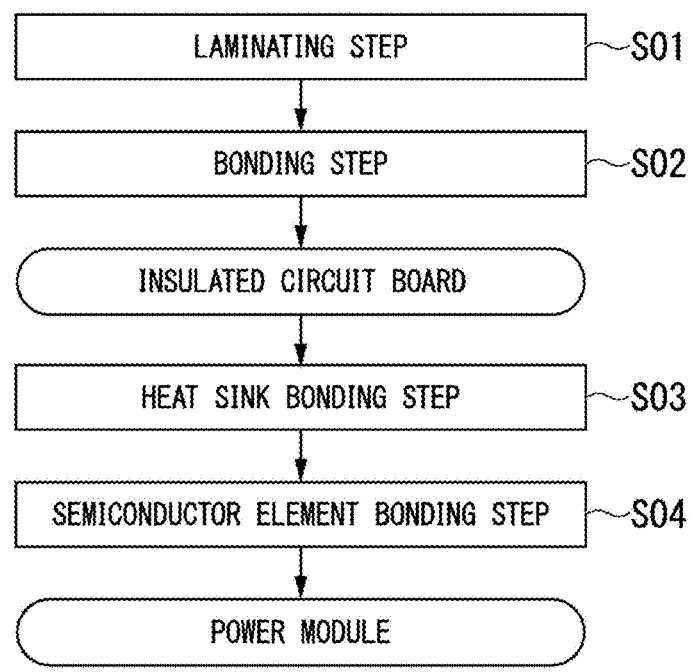
FIG. 3 is a flowchart showing a method for manufacturing an insulated circuit board (bonded body) which is the first embodiment of the present invention and a method for manufacturing a power module.

Here, an enlarged view of a bonded interface between the circuit layer 12 (copper sheet 22) and the ceramic substrate 11 and between the metal layer 13 (copper sheet 23) and the ceramic substrate 11 is shown in FIG. 2.

As shown in FIG. 2, a bonding layer 30 is formed at the bonded interface between the ceramic substrate 11 and the circuit layer 12 (copper sheet 22) and the metal layer 13 (copper sheet 23).

As shown in FIG. 2, the bonding layer 30 is provided with an active metal compound layer 31 formed of a compound including an active metal formed on the ceramic substrate 11 side and an alloy layer 32 formed between the active metal compound layer 31 and the circuit layer 12 (copper sheet 22) and the metal layer 13 (copper sheet 23).

In the present embodiment, as described below, since the circuit layer 12 (copper sheet 22) and the metal layer 13 (copper sheet 23) are bonded to the ceramic substrate 11 using a Cu—P-based brazing material 24 and Ti as an active metal, the active metal compound layer 31 is formed of a titanium compound.

The active metal compound layer 31 is formed of a crystalline titanium compound (titanium oxide or titanium nitride). It is possible to confirm the crystallinity of the active metal compound layer 31 by observing an electron diffraction pattern with a transmission electron microscope. In the present embodiment, the active metal compound layer 31 is formed of titanium oxide and a rutile-type electron diffraction pattern is observed.

Here, in the present embodiment, the thickness of the active metal compound layer 31 is preferably in the range of 1.5 nm or more and 150 nm or less.

In addition, in the bonding layer 30, the Al concentration is set to be 0.15 at % or less in a range E with a thickness of 0.5 μm to 3 μm from the interface between the circuit layer 12 (copper sheet 22) side and the metal layer 13 (copper sheet 23) side of the active metal compound layer 31 toward the circuit layer 12 (copper sheet 22) and the metal layer 13 (copper sheet 23). That is, the Al concentration is set to be 0.15 at % or less in a region extending in the range E with a thickness of 2.5 μm between a surface extending at a position of 0.5 μm (Δt1) and a surface extending at a position of 3 μm (Δt2) toward the circuit layer 12 (copper sheet 22) and the metal layer 13 (copper sheet 23), from the interface of the active metal compound layer 31 on the circuit layer 12 (copper sheet 22) side and the metal layer 13 (copper sheet 23) side toward the circuit layer 12 (copper sheet 22) and the metal layer 13 (copper sheet 23). Here, the Al concentration is an average value in the thickness range E.

The Al component in the bonding layer 30 is produced by a component material of the ceramic substrate 11, that is, a part of the Al-based ceramic, decomposing during bonding of the ceramic substrate 11 and the copper sheets 22 and 23, and the Al component diffusing toward the bonding layer 30. For example, in the present embodiment, AlN forming the ceramic substrate 11 is decomposed so as to diffuse Al.

It is possible to control the Al concentration in the thickness range E of the bonding layer 30 by adjusting the decomposition state of the ceramic substrate 11 through the heating temperature, the holding time, the amount of brazing material, and the amount of active metal in a bonding step S02 during bonding of the ceramic substrate 11 and the copper sheets 22 and 23.

In addition, the alloy layer 32 contains an alloy or an intermetallic compound including any of the components of the brazing material used during the bonding. In the present embodiment, as described below, since the Cu—P-based brazing material 24, specifically, a Cu—P—Sn—Ni brazing material, is used, the alloy layer 32 has an alloy or an intermetallic compound including any of Cu, P, Sn, or Ni.

Next, a description will be given of a method for manufacturing the insulated circuit board 10 according to the present embodiment described above with reference to FIG. 3 and FIG. 4.

First, as shown in FIG. 4, the Cu—P-based brazing material 24, a titanium material 25, and the copper sheet 22 to be the circuit layer 12 are sequentially laminated on one surface (the upper surface in FIG. 4) of the ceramic substrate 11, while, the Cu—P-based brazing material 24, the titanium material 25, and the copper sheet 23 to be the metal layer 13 are sequentially laminated on the other surface (the lower surface in FIG. 4) of the ceramic substrate 11 (laminating step S01).

In the present embodiment, as the Cu—P-based brazing material 24, a Cu—P—Sn—Ni brazing material is used which includes P in the range of 3 mass % or more and 10 mass % or less, which includes Sn, which is a low-melting point element, in the range of 7 mass % or more and 50 mass % or less, and which includes Ni in a range of 2 mass % or more and 15 mass % or less.

Here, the thickness of the Cu—P-based brazing material 24 is in a range of 10 μm or more and 50 μm or less.

In the present embodiment, the thickness of the titanium material 25 including Ti as an active metal element is in a range of 0.05 μm or more and 2 μm or less. Here, the titanium material 25 is preferably formed by vapor deposition or sputtering in a case where the thickness thereof is 0.1 μm or more and 1.0 μm or less, and a foil material is preferably used in a case where the thickness thereof is 1.0 μm or more.

Next, the ceramic substrate 11, the Cu—P-based brazing material 24, the titanium material 25, the copper sheet 22, and the copper sheet 23 are charged into a vacuum heating furnace in a state of being pressed (pressure: 1 to 35 kgf/cm$^2$ (0.1 MPa to 3.5 MPa)) in the laminating direction, heated, and bonded (bonding step S02).

In the present embodiment, the pressure inside the vacuum heating furnace is in a range of $10^{-6}$ Pa or more and $10^{-3}$ Pa or less.

In addition, the heating temperature is set to be in a range of 770° C. or higher and 950° C. or lower and the holding time at the heating temperature is set to be in a range of 5 minutes or more and 120 minutes or less. Furthermore, the heating rate from 600° C. to 700° C. is set to be in a range of 5° C./min or more and 20° C./min or less.

Here, in a case where the thickness of the titanium material 25 including Ti which is an active metal element is less than 0.05 μm, there is a concern that the bonding between the ceramic substrate 11 and the copper sheets 22 and 23 may be insufficient. On the other hand, in a case where the thickness of the titanium material 25 exceeds 2 μm, there is a concern that decomposition of the ceramic substrate 11 will be promoted, the Al concentration in the thickness range E of the bonding layer 30 will exceed 0.15 at %, and cracks may be generated during bonding with ultrasonic waves.

From the above, in the present embodiment, the thickness of the titanium material 25 is set to be in a range of 0.05 μm or more and 2 μm or less.

In order to reliably bond the ceramic substrate 11 and the copper sheets 22 and 23, the lower limit of the thickness of the titanium material 25 is preferably 0.1 μm or more, and more preferably 0.15 μm or more. On the other hand, in order to suppress the decomposition of the ceramic substrate 11, the upper limit of the thickness of the titanium material 25 is preferably 1.5 μm or less, and more preferably 1.0 μm or less.

In a case where the thickness of the Cu—P-based brazing material 24 is less than 10 μm, there is a concern that the bonding between the ceramic substrate 11 and the copper sheets 22 and 23 may be insufficient. On the other hand, in a case where the thickness of the Cu—P-based brazing material 24 exceeds 50 μm, there is a concern that decomposition of the ceramic substrate 11 will be promoted, the Al concentration in the thickness range E of the bonding layer 30 will exceed 0.15 at %, and cracks may be generated during bonding with ultrasonic waves.

From the above, in the present embodiment, the thickness of the Cu—P-based brazing material 24 is set in the range of 10 μm to 50 μm.

In order to securely bond the ceramic substrate 11 and the copper sheets 22 and 23, the lower limit of the thickness of the Cu—P-based brazing material 24 is preferably 15 μm or more, and more preferably 20 μm or more. On the other hand, in order to suppress the decomposition of the ceramic substrate 11, the upper limit of the thickness of the Cu—P-based brazing material 24 is preferably 40 μm or less, and more preferably 35 μm or less.

In a case where the heating temperature is less than 770° C. in the bonding step S02, there is a concern that the bonding between the ceramic substrate 11 and the copper sheets 22 and 23 may be insufficient. On the other hand, in a case where the heating temperature exceeds 950° C. in the bonding step S02, there is a concern that microcracks may be generated due to thermal deterioration of the ceramic substrate 11 and that cracking may be generated in the ceramic substrate 11 during bonding with ultrasonic waves.

From the above, in the present embodiment, the heating temperature is set to be in a range of 770° C. or higher and 950° C. or lower in the bonding step S02.

In order to securely bond the ceramic substrate 11 and the copper sheets 22 and 23, the lower limit of the heating temperature in the bonding step S02 is preferably 800° C. or higher, and more preferably 830° C. or higher. On the other hand, in order to suppress thermal deterioration of the ceramic substrate 11, the upper limit of the heating temperature in the bonding step S02 is preferably 940° C. or lower, and more preferably 930° C. or lower.

In a case where the holding time at the heating temperature is less than 5 minutes in the bonding step S02, there is a concern that the bonding between the ceramic substrate 11 and the copper sheets 22 and 23 may be insufficient. On the other hand, in a case where the holding time at the heating temperature exceeds 120 minutes in the bonding step S02, there is a concern that decomposition of the ceramic substrate 11 will be promoted, the Al concentration in the thickness range E of the bonding layer 30 will exceed 0.15 at %, and cracks may be generated during bonding with ultrasonic waves.

From the above, in the present embodiment, the holding time at the heating temperature is set to be in a range of 5 minutes or more and 120 minutes or less.

In order to securely bond the ceramic substrate 11 and the copper sheets 22 and 23, the lower limit of the holding time at the heating temperature in the bonding step S02 is preferably 15 minutes or more, and more preferably 30 minutes or more. On the other hand, in order to suppress decomposition of the ceramic substrate 11, the upper limit of the holding time at the heating temperature in the bonding step S02 is preferably 100 minutes or less, and more preferably 90 minutes or less.

In a case where the heating rate from 600° C. to 700° C. in the bonding step S02 is less than 5° C./min, there is a concern that decomposition of the ceramic substrate 11 will be promoted, the Al concentration in the thickness range E of the bonding layer 30 will exceed 0.15 at %, and cracks may be generated during bonding with ultrasonic waves. On the other hand, in a case where the heating rate from 600° C. to 700° C. in the bonding step S02 exceeds 20° C./min, there is a concern that microcracks may be generated in the ceramic substrate 11 due to thermal shock and cracking may be generated in the ceramic substrate 11 during bonding with ultrasonic waves.

From the above, in the present embodiment, the heating rate from 600° C. to 700° C. in the bonding step S02 is set in the range of 5° C./min or more to 20° C./min or less.

In order to suppress the decomposition of the ceramic substrate 11, the lower limit of the heating rate from 600° C. to 700° C. in the bonding step S02 is preferably 7° C./min or more, and more preferably 10° C./min or more. On the other hand, in order to suppress the generation of microcracks due to thermal shock, the upper limit of the heating rate from 600° C. to 700° C. in the bonding step S02 is preferably 15° C./min or less, and more preferably 13° C./min or less.

The insulated circuit board 10 according to the present embodiment is manufactured by the laminating step S01 and the bonding step S02 above.

Next, the heat sink 51 is soldered and bonded to the other surface side of the metal layer 13 of the insulated circuit board 10 (heat sink bonding step S03).

Furthermore, the semiconductor element 3 is bonded by soldering to one surface of the circuit layer 12 of the insulated circuit board 10 (semiconductor element bonding step S04).

Through the above steps, the power module 1 shown in FIG. 1 is produced.

According to the insulated circuit board 10 (bonded body) of the present embodiment having the above configuration, since the active metal compound layer 31 formed of crystalline titanium oxide is formed on the ceramic substrate 11 side of the bonding layer 30 formed between the ceramic substrate 11 and the circuit layer 12 and the metal layer 13, it is possible to suppress the generation of cracks starting from the active metal compound layer 31 and to suppress the ceramic substrate 11 from peeling from the circuit layer 12 and the metal layer 13 even in a case where ultrasonic waves are applied thereto.

Furthermore, in the present embodiment, since the Al concentration in the bonding layer 30 is suppressed to 0.15 at % or less in the range E with a thickness of 0.5 μm to 3 μm from the interface of the circuit layer 12 and the metal layer 13 side of the active metal compound layer 31 toward the circuit layer 12 and metal layer 13, it is possible to suppress the generation of cracks in the bonding layer 30 even in a case where ultrasonic waves are applied thereto.

Here, the Al concentration in the bonding layer 30 in the thickness range E is preferably 0.10 at % or less, and more preferably 0.07 at % or less.

In addition, in the present embodiment, since the thickness of the active metal compound layer 31 is 1.5 nm or more, the strength in the vicinity of the bonded interface of the ceramic substrate 11 is appropriately improved by the active metal compound layer 31 and it is possible to suppress the generation of cracking of the ceramic substrate 11 during loading of the thermal cycle. On the other hand, since the thickness of the active metal compound layer 31 is 150 nm or less, it is possible to suppress the thermal strain generated in the ceramic substrate 11 during loading of the thermal cycles without excessively forming the hard active metal compound layer 31 and to suppress the generation of cracking in the ceramic substrate 11 during loading of the thermal cycles.

The lower limit of the thickness of the active metal compound layer 31 is preferably 3 nm or more, and more preferably 5 nm or more. On the other hand, the upper limit of the thickness of the active metal compound layer 31 is preferably 60 nm or less, and more preferably 15 nm or less.

Further, in the present embodiment, since the ceramic substrate 11 is formed of aluminum nitride (AlN), it is possible to manufacture the insulated circuit board 10 having excellent insulation and heat resistance.

Furthermore, since the active metal compound layer 31 is formed of titanium oxide, the bonding property between the ceramic substrate 11 and the circuit layer 12 and the metal layer 13 is improved and it is possible to further suppress the ceramic substrate 11 from peeling from the circuit layer 12 and the metal layer 13.

Furthermore, in the present embodiment, since the metal layer 13 is formed on the surface of the ceramic substrate 11 on the side opposite to the circuit layer 12, it is possible to efficiently dissipate the heat generated in the semiconductor element 3. In addition, it is possible to suppress the generation of warpage of the ceramic substrate 11.

In addition, since the metal layer 13 is formed of copper or a copper alloy, it is possible to realize the insulated circuit board 10 having excellent heat dissipation.

Second Embodiment

Next, a description will be given of a second embodiment of the present invention. In addition, the same reference numerals are used in the description where the configuration is the same as the first embodiment and detailed description thereof is omitted.

Figure 5:
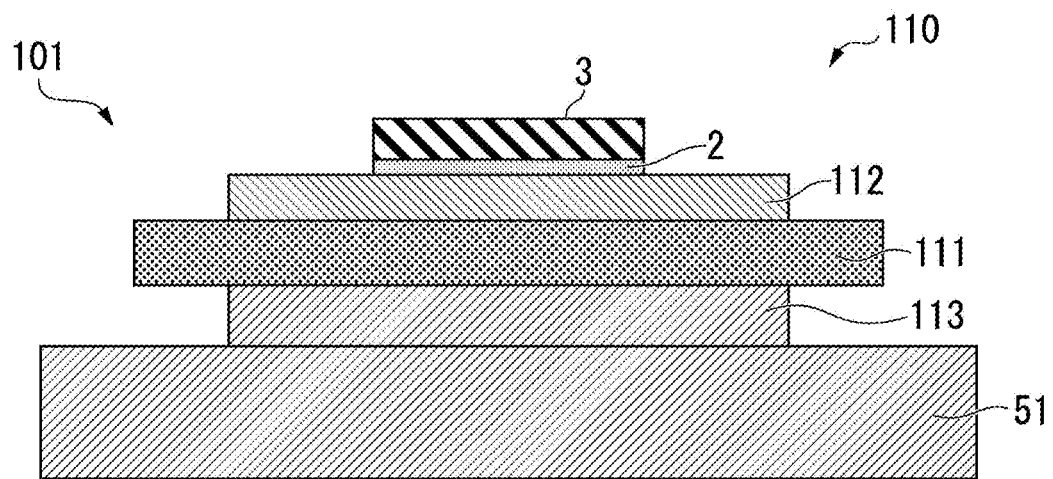
FIG. 5 is a schematic explanatory view of a power module using an insulated circuit board (bonded body) which is a second embodiment of the present invention.

FIG. 5 shows a power module 101 provided with an insulated circuit board 110 according to the second embodiment of the present invention.

The power module 101 is provided with the insulated circuit board 110, the semiconductor element 3 bonded via the solder layer 2 to one surface (the upper surface in FIG. 5) of the insulated circuit board 110, and the heat sink 51 bonded to a lower side of the insulated circuit board 110.

A ceramic substrate 111 is formed of an Al-based ceramic, for example, aluminum nitride (AlN), alumina ($Al_2O_3$), or the like. In the present embodiment, the ceramic substrate 111 is formed of alumina ($Al_2O_3$) having excellent heat dissipation. Alumina ($Al_2O_3$) forming the ceramic substrate 111 of the present embodiment includes $SiO_2$ as a sintering aid.

In addition, the thickness of the ceramic substrate 111 is set, for example, in the range of 0.2 to 1.5 mm, and 0.635 mm is used in the present embodiment.

Figure 8:
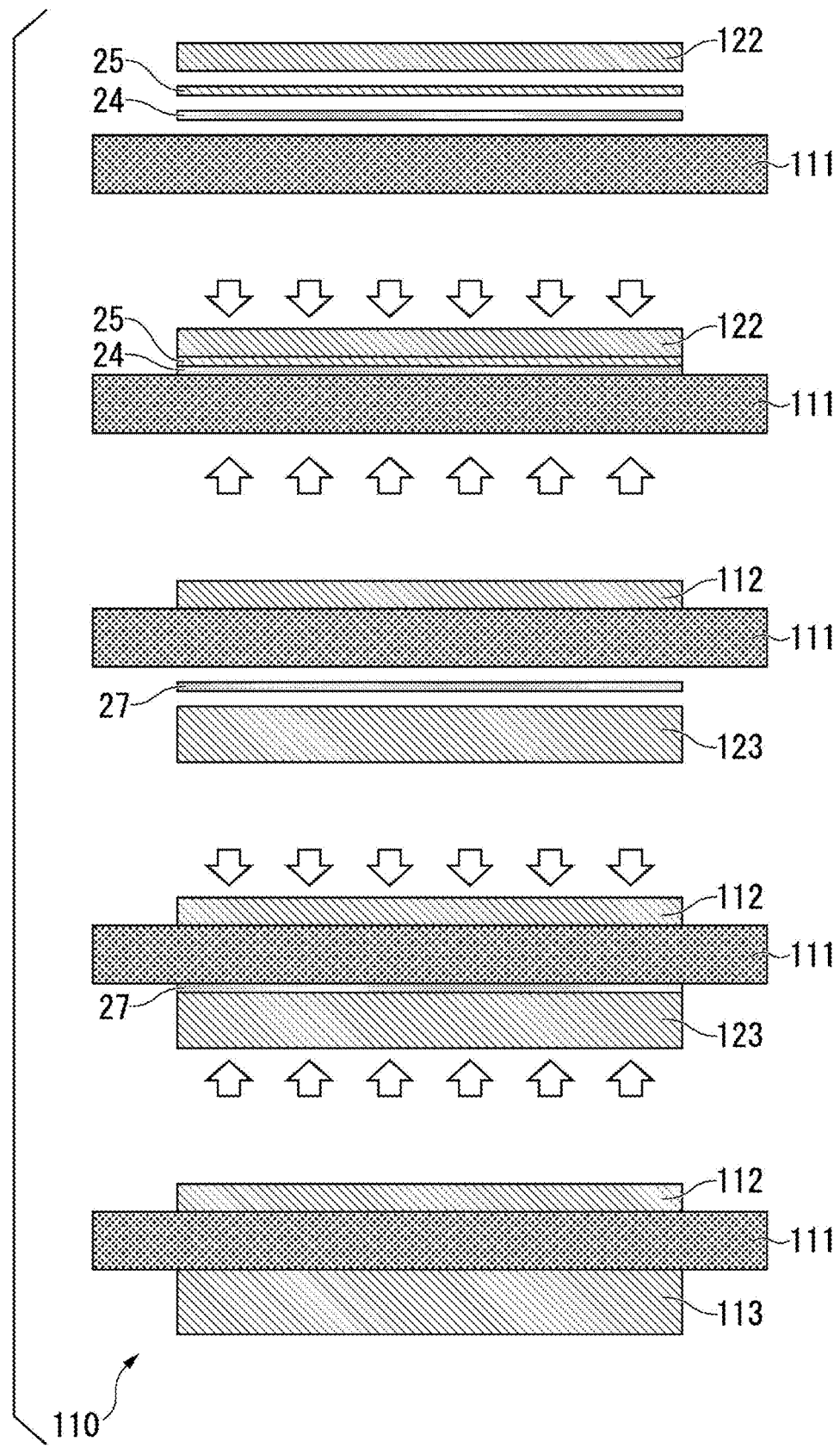
FIG. 8 is an explanatory view showing a method for manufacturing an insulated circuit board (bonded body) which is the second embodiment of the present invention.

As shown in FIG. 8, a circuit layer 112 is formed by bonding a copper sheet 122 formed of copper or a copper alloy to one surface of the ceramic substrate 111. In the present embodiment, a rolled plate of oxygen-free copper is used as the copper sheet 122 forming the circuit layer 112. A circuit pattern is formed on the circuit layer 112, and one surface thereof (the upper surface in FIG. 5) is a mounting surface on which the semiconductor element 3 is mounted. Here, the thickness of the circuit layer 112 (copper sheet 122) is set to be in a range of 0.1 mm or more and 1.0 mm or less and is set to be 0.6 mm in the present embodiment.

As shown in FIG. 8, a metal layer 113 is formed by bonding an aluminum sheet 123 formed of aluminum or an aluminum alloy to the other surface of the ceramic substrate

111. In the present embodiment, a rolled plate of aluminum (4N aluminum) having a purity of 99.99 mass % or more is used as the aluminum sheet 123 forming the metal layer 113. Here, the thickness of the metal layer 113 (aluminum sheet 123) is set in the range of 0.2 mm or more and 6 mm or less and is set to be 2.0 mm in the present embodiment.

In the present embodiment, the heat sink 51 is bonded to the metal layer 113 of the insulated circuit board 110 using an Al—Si-based brazing material or the like.

Figure 6:
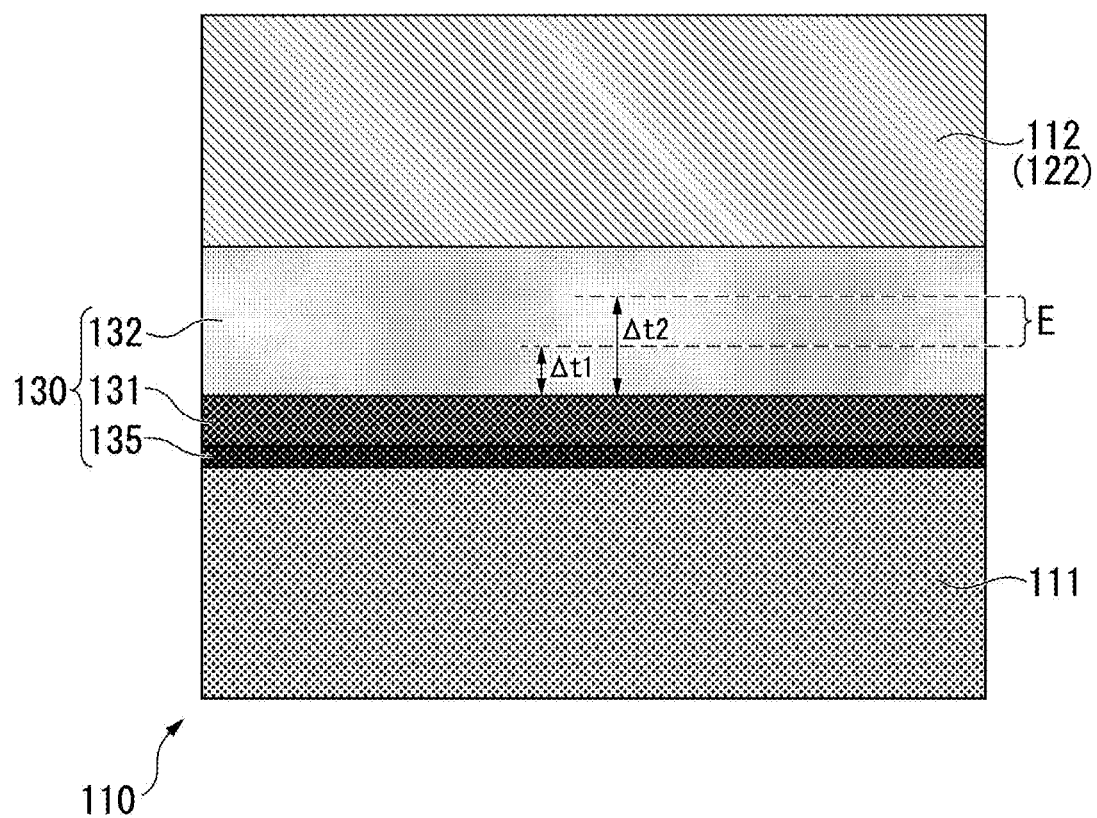
FIG. 6 is a schematic view of a bonded interface between a circuit layer (copper member) and a ceramic substrate (ceramic member) of an insulated circuit board (bonded body) which is the second embodiment of the present invention.

Here, an enlarged view of the bonded interface between the circuit layer 112 (copper sheet 122) and the ceramic substrate 111 is shown in FIG. 6.

As shown in FIG. 6, a bonding layer 130 is formed at a bonded interface between the ceramic substrate 111 and the circuit layer 112 (copper sheet 122).

As shown in FIG. 6, the bonding layer 130 is provided with an active metal compound layer 131 formed of a compound including an active metal formed on the ceramic substrate 111 side, and an alloy layer 132 formed between the active metal compound layer 131 and the circuit layer 112 (copper sheet 122).

Furthermore, in the present embodiment, a Si-concentrated layer 135 is formed between the active metal compound layer 131 and the ceramic substrate 111.

In the present embodiment, as described below, since the circuit layer 112 (copper sheet 122) and the ceramic substrate 111 are bonded using the Cu—P-based brazing material 24 and the titanium material 25 containing Ti as an active metal, the active metal compound layer 131 is formed of a titanium compound.

It is presumed that the Si-concentrated layer 135 is formed of $SiO_2$ included as a sintering aid in the ceramic substrate 111 formed of alumina ($Al_2O_3$).

The active metal compound layer 131 is formed of a crystalline titanium compound (titanium oxide or titanium nitride). Here, it is possible to confirm the crystallinity of the active metal compound layer 131 by observing an electron diffraction pattern with a transmission electron microscope. In the present embodiment, the active metal compound layer 131 is formed of titanium oxide and a rutile-type electron diffraction pattern is observed.

Here, in the present embodiment, the thickness of the active metal compound layer 131 is preferably in the range of 1.5 nm or more and 150 nm or less.

In addition, in the bonding layer 130, the Al concentration is 0.15 at % or less in the range E with a thickness of 0.5 μm to 3 μm from the interface of the active metal compound layer 131 on the circuit layer 112 (copper sheet 122) side toward the circuit layer 112 (copper sheet 122).

In addition, the alloy layer 132 contains an alloy or an intermetallic compound including any of the components of the brazing material used during the bonding. In the present embodiment, since the Cu—P-based brazing material 24, specifically, the Cu—P—Sn—Ni brazing material, is used, the alloy layer 32 has an alloy or an intermetallic compound including any of Cu, P, Sn, and Ni.

Figure 7:
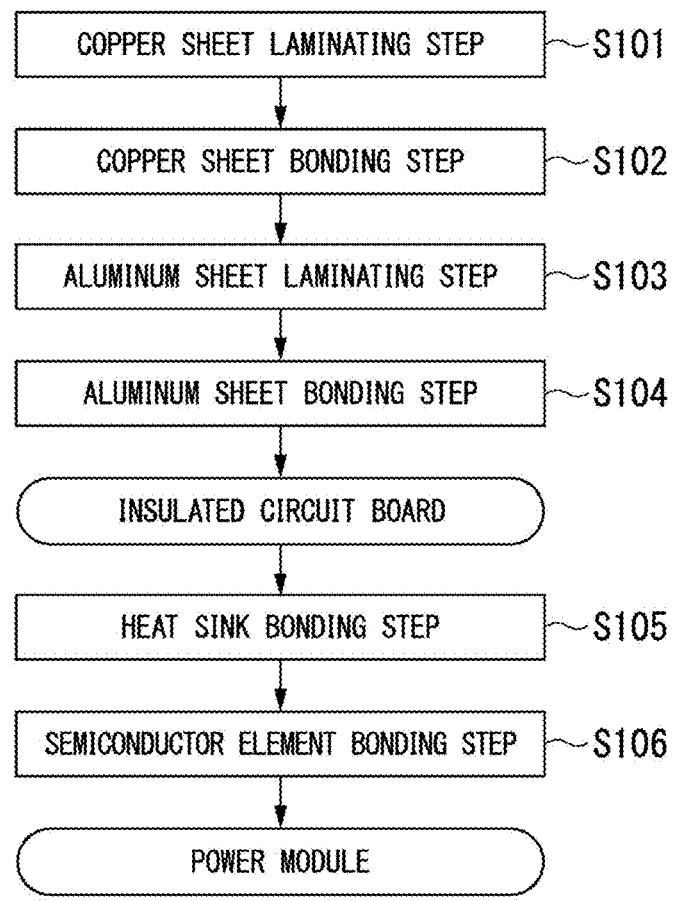
FIG. 7 is a flowchart showing a method for manufacturing an insulated circuit board (bonded body) which is the second embodiment of the present invention and a method for manufacturing a power module.

Next, a description will be given of a method for manufacturing the insulated circuit board 110 according to the present embodiment described above with reference to FIG. 7 and FIG. 8.

First, as shown in FIG. 8, the Cu—P-based brazing material 24, the titanium material 25, and the copper sheet 122 to be the circuit layer 112 are sequentially laminated on one surface (the upper surface in FIG. 8) of the ceramic substrate 111 (copper sheet laminating step S101). The same conditions as in the first embodiment apply to the thickness and the like of the Cu—P-based brazing material 24 and the titanium material 25.

Next, the ceramic substrate 111, the Cu—P-based brazing material 24, the titanium material 25, and the copper sheet 122 are charged into a vacuum heating furnace in a state of being pressed (pressure: 1 to 35 kgf/cm$^2$ (0.1 MPa to 3.5 MPa)) in the laminating direction, heated, and bonded (copper sheet bonding step S102).

In the present embodiment, the pressure inside the vacuum heating furnace is in a range of $10^{-6}$ Pa or more and $10^{-3}$ Pa or less.

In addition, the heating temperature is set to be in a range of 770° C. or higher and 950° C. or lower and the holding time at the heating temperature is set to be in a range of 5 minutes or more and 120 minutes or less. Furthermore, the heating rate from 600° C. to 700° C. is set to be in a range of 5° C./min or more to 20° C./min or less.

Next, as shown in FIG. 8, on the other surface (the lower surface in FIG. 8) of the ceramic substrate 111, an Al—Si-based brazing material 27 and an aluminum sheet 123 to be the metal layer 113 are sequentially laminated (aluminum sheet laminating step S103).

Here, in the present embodiment, a brazing material foil formed of an aluminum alloy containing Si in a range of 7 mass % or more and 12 mass % or less is used as the Al—Si-based brazing material 27 and the thickness of the Al—Si-based brazing material 27 is set to be in a range of 5 μm or more and 30 μm or less.

Next, the ceramic substrate 111, the Al—Si-based brazing material 27, and the aluminum sheet 123 are charged into a vacuum heating furnace in a state of being pressed (pressure: 1 to 35 kgf/cm$^2$ (0.1 MPa to 3.5 MPa)) in the laminating direction, heated, and bonded (aluminum sheet bonding step S104).

In the present embodiment, the pressure inside the vacuum heating furnace is in a range of $10^{-6}$ Pa or more and $10^{-3}$ Pa or less. In addition, the heating temperature is in a range of 580° C. or higher and 650° C. or lower and the holding time at the heating temperature is in the range of 1 minute or more and 180 minutes or less.

The insulated circuit board 110 which is the present embodiment is manufactured by the copper sheet laminating step S101, the copper sheet bonding step S102, the aluminum sheet laminating step S103, and the aluminum sheet bonding step S104 above.

Next, the heat sink 51 is bonded to the other surface of the metal layer 113 of the insulated circuit board 110 using an Al—Si-based brazing material (heat sink bonding step S105).

Furthermore, the semiconductor element 3 is bonded by soldering to one surface of the circuit layer 112 of the insulated circuit board 110 (semiconductor element bonding step S106).

Through the above steps, the power module 101 shown in FIG. 5 is produced.

According to the insulated circuit board 110 (bonded body) of the present embodiment having the configuration described above, since the active metal compound layer 131 formed of crystalline titanium oxide is formed on the ceramic substrate 111 side of the bonding layer 130 formed between the ceramic substrate 111 and the circuit layer 112, it is possible to suppress the generation of cracks starting from the active metal compound layer 131 and to suppress peeling of the ceramic substrate 111 and the circuit layer 112 even when ultrasonic waves are applied thereto.

Furthermore, in the present embodiment, since the Al concentration in the bonding layer 130 is suppressed to 0.15 at % or less in the range E with a thickness of 0.5 μm to 3 μm from the interface of the active metal compound layer 131 on the circuit layer 112 side toward the circuit layer 112, it is possible to suppress the generation of cracks in the bonding layer 130 even when ultrasonic waves are applied thereto.

Here, the Al concentration in the bonding layer 130 in the thickness range E is preferably 0.10 at % or less, and more preferably 0.07 at % or less.

In addition, in the present embodiment, since the thickness of the active metal compound layer 131 is in the range of 1.5 nm or more and 150 nm or less, it is possible to suppress the generation of cracking in the ceramic substrate 11 during loading of thermal cycles.

Here, the lower limit of the thickness of the active metal compound layer 131 is preferably 3 nm or more, and more preferably 5 nm or more. On the other hand, the upper limit of the thickness of active metal compound layer 131 is preferably 60 nm or less, and more preferably 15 nm or less.

In addition, in the present embodiment, since the ceramic substrate 111 is formed of alumina ($Al_2O_3$), it is possible to manufacture the insulated circuit board 110 having excellent insulation and heat resistance.

Furthermore, since the active metal compound layer 131 is formed of titanium oxide, the bonding property between the ceramic substrate 111 and the circuit layer 112 is improved and it is possible to further suppress peeling of the ceramic substrate 111 and the circuit layer 112.

Furthermore, in the present embodiment, since the metal layer 113 is formed on the surface of the ceramic substrate 111 on the side opposite to the circuit layer 112, it is possible to efficiently dissipate the heat generated in the semiconductor element 3. In addition, it is possible to suppress the generation of warpage of the ceramic substrate 111. In addition, since the metal layer 113 is formed of aluminum or an aluminum alloy, it is possible to absorb thermal stress in the metal layer 113 and to suppress the load on the ceramic substrate 111 during the thermal cycle.

A description was given above of the embodiments of the present invention, but the present invention is not limited thereto, and it is possible to make appropriate changes thereto without departing from the technical idea of the present invention.

For example, in the present embodiment, a description was given in which a metal layer was formed on the surface of the ceramic substrate on a side opposite to the circuit layer; however, the present invention is not limited thereto and the metal layer may not be provided.

In addition, the heat sink is not limited to the heat sink illustrated in the present embodiment, and the structure of the heat sink is not particularly limited.

Furthermore, a buffer layer formed of aluminum, an aluminum alloy, or a composite material including aluminum (for example, AlSiC or the like) may be provided between the heat sink and the metal layer.

In addition, in the present embodiment, a description was given in which a power module is configured by mounting a semiconductor element on an insulated circuit board; however, the present invention is not limited thereto. For example, an LED module may be configured by mounting an LED element on a circuit layer of an insulated circuit board, or a thermoelectric module may be configured by mounting a thermoelectric element on a circuit layer of an insulated circuit board.

Furthermore, in the present embodiment, a description was given in which Ti is used as the active metal; however, the present invention is not limited thereto, and one type or two or more types of active metals selected from Ti, Nb, Hf, and Zr may be used. In addition, as a brazing material used when bonding a ceramic substrate and a copper sheet, a description was given of a Cu—P—Sn—Ni brazing material as an example; however, the brazing material is not limited thereto, and other brazing materials may be used.

Furthermore, in the present embodiment, a description was given in which the alloy layer has an alloy or an intermetallic compound including any of Cu, P, Sn, and Ni; however, the present invention is not limited thereto and any alloy or intermetallic compound including any of the components of the brazing materials used during bonding is sufficient. For example, in a case where the brazing material contains Zn, an alloy or an intermetallic compound including Zn may be contained.

EXAMPLES

Example 1

A copper sheet (6 mm×6 mm×0.3 mm thickness) formed of oxygen-free copper is sequentially laminated using a brazing material and an active metal material described in Table 1 on one surface of a ceramic substrate (26 mm×26 mm×0.635 mm thickness) formed of the material shown in Table 1 to form a laminate.

Then, the laminate was put into a vacuum heating furnace in a state of being pressed under the load shown in Table 2, and heated to bond a copper sheet to one surface of the ceramic substrate. The heating temperature and time were as shown in Table 2.

In the manner described above, the bonded bodies of the Examples of the present invention and the Comparative Examples were obtained. For the obtained bonded bodies, the "Material and Crystallinity of Active Metal Compound Layer", the "Al Concentration in Region E of Bonding Layer", and the "Ultrasonic Wave Bonding Property" were evaluated.

(Material and Crystallinity of Active Metal Compound Layer)

Measurement was carried out using a transmission electron microscope (Titan ChemiSTEM, manufactured by FEI, accelerating voltage: 200 kV) at a magnification of 80,000 times to acquire element mapping of the N, O, and active metal element using the energy dispersive X-ray analysis method (NSS7 manufactured by Thermo Scientific). It was determined that an active metal compound layer was present in a case where the active metal element and N or O existed in the same region.

Furthermore, in a case where lattice fringes were observed in the high-resolution image of the active metal compound layer and diffraction spots were confirmed in a diffraction image obtained by carrying out a fast Fourier transform on the high-resolution image, the active metal compound layer was determined to be crystalline.

Table 2 shows the evaluation results.

(Al Concentration in Region E of Bonding Layer)

As a method for measuring the Al concentration in the bonding portion, a cross-section of the bonding portion was analyzed by EPMA (electron beam microanalyzer, JXA-8530F manufactured by JEOL Ltd.), a range of 0.5 μm or more and 3 μm or less from one surface of the active metal compound region was quantitatively analyzed, and the Al concentration was measured. Specifically, 10 points at arbitrary places in the above range were analyzed and the average value thereof was taken as the Al concentration.

Table 2 shows the evaluation results.

Figure 9:
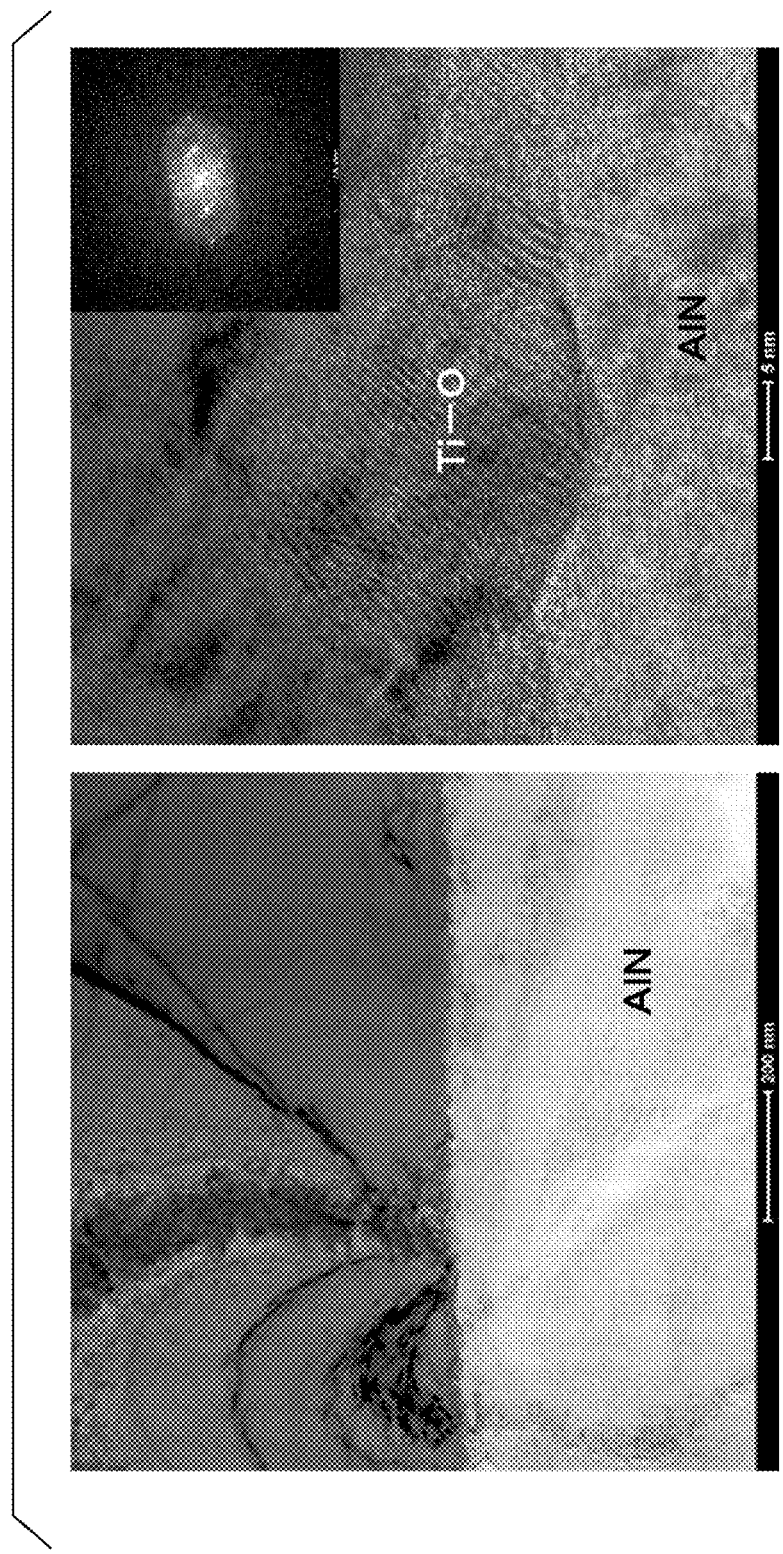
FIG. 9 shows observation results in the vicinity of the ceramic substrate of Example 3 of the present invention in the Examples.

In addition, FIG. 9 shows a transmission electron microscope observation of the bonded interface between the ceramic substrate and the copper sheet of Example 3 of the present invention.

Figure 10:
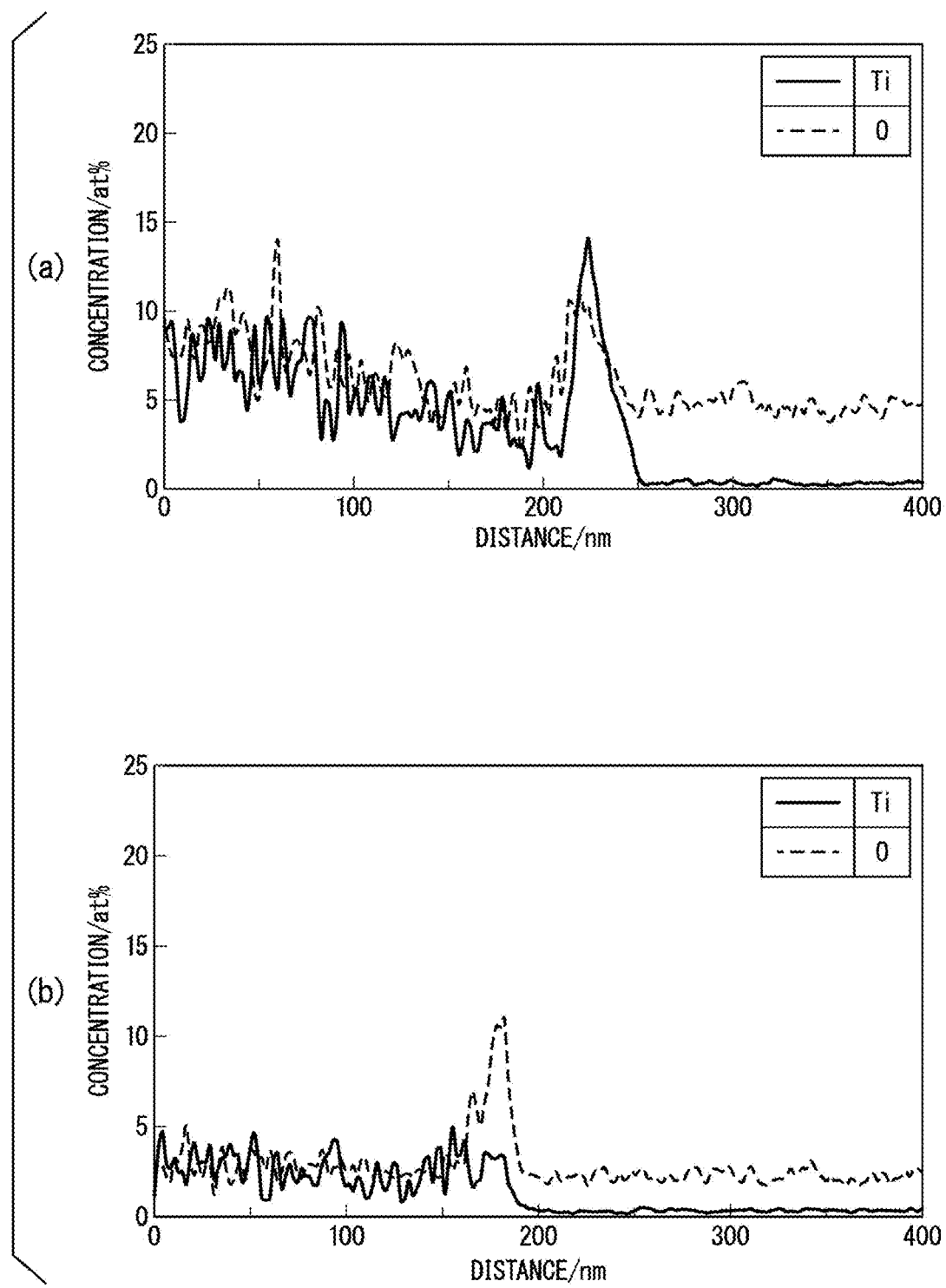
FIG. 10 shows line analysis results in the vicinity of the ceramic substrate in Examples. (a) is Example 3 of the present invention and (b) is Comparative Example 1.

Furthermore, FIG. 10 shows the line analysis results of the bonded interface of Example 3 of the present invention and Comparative Example 1.

Figure 11:
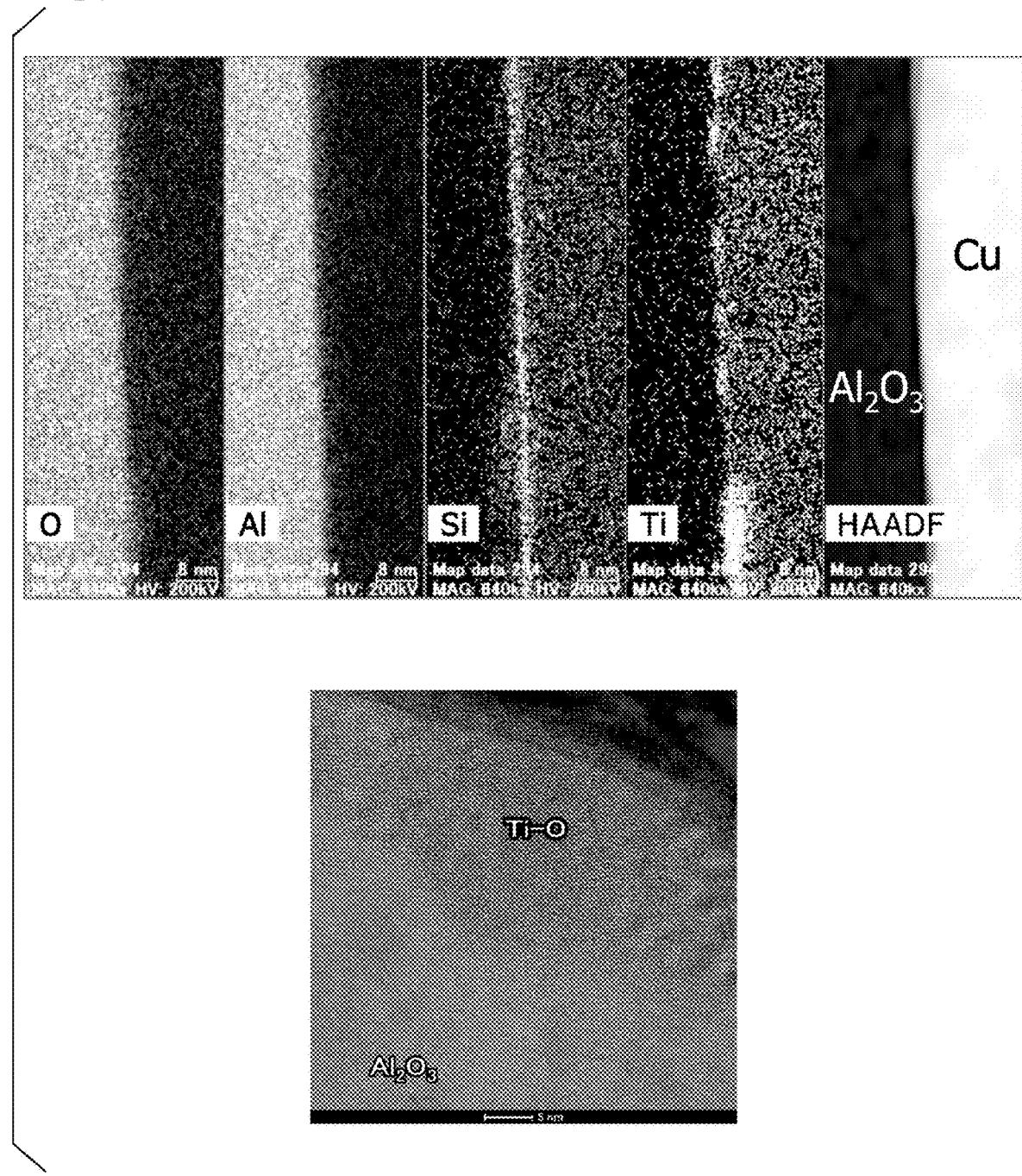
FIG. 11 is an element mapping diagram in the vicinity of the ceramic substrate of Example 4 of the present invention in the Examples.

In addition, FIG. 11 shows element mapping of the bonded interface between the ceramic substrate and the copper sheet of Example 4 of the present invention.

(Presence or Absence of Peeling after Ultrasonic Wave Bonding)

Using an ultrasonic wave metal bonding machine (60C-904, manufactured by Ultrasonic Engineering Co., Ltd.), a copper terminal (10 mm×5 mm×1 mm thick) was bonded to the obtained bonded body by ultrasonic waves under the condition of a Co-plus amount of 0.3 mm.

After bonding, a product in which peeling occurred at the bonded interface between the copper sheet and the ceramic substrate was evaluated as "C". In addition, for products in which peeling was not confirmed, the bonded interface between the copper sheet and the ceramic substrate was further inspected using an ultrasonic flaw detector (Fine-SAT200 manufactured by Hitachi Solutions, Ltd.), products where peeling or ceramic cracking was observed were evaluated as "B", and products where neither was confirmed were evaluated as "A".

Table 2 shows the evaluation results.

TABLE 1

| | Ceramic substrate Material | Brazing material | | Active metal material | |
|---|---|---|---|---|---|
| | | Material | Thickness (μm) | Material | Thickness (μm) |
| Example 1 | AlN | Cu-7 mass % P-15 mass % Sn10 mass % Ni | 35 | Ti | 0.5 |
| Example 2 | AlN | Cu-7 mass % P-15 mass % Sn10 mass % Ni | 20 | Ti | 0.1 |
| Example 3 | AlN | Cu-6.3 mass % P-9.3 mass % Sn-7 mass % Ni | 20 | Ti | 0.1 |
| Example 4 | $Al_2O_3$ | Cu-7 mass % P-15 mass % Sn5 mass % Cr | 35 | Hf | 0.5 |
| Example 5 | AlN | Cu-7 mass % P-15 mass % Sn3 mass % Mn | 40 | Zr | 0.05 |
| Example 6 | AlN | Cu-7 mass % P | 35 | Ti | 1.5 |
| Example 7 | AlN | Cu-6.3 mass % P-9.3 mass % Sn-7 mass % Ni | 25 | Ti | 0.5 |
| Example 8 | $Al_2O_3$ | Cu-7 mass % P-15 mass % Sn3 mass % Mn | 10 | Zr | 0.1 |
| Example 9 | $Al_2O_3$ | Cu-7 mass % P-15 mass % Sn5 mass % Cr | 35 | Nb | 2 |
| Comparative Example 1 | AlN | Cu-6.3 mass % P-9.3 mass % Sn-7 mass % Ni | 25 | Ti | 0.5 |
| Comparative Example2 | AlN | Cu-6.3 mass % P-9.3 mass % Sn-7 mass % Ni | 25 | Ti | 0.5 |
| Comparative Example3 | AlN | Cu-6.3 mass % P-9.3 mass % Sn-7 mass % Ni | 25 | Ti | 0.5 |
| Comparative Example4 | AlN | Cu-6.3 mass % P-9.3 mass % Sn-7 mass % Ni | 25 | Ti | 0.5 |

TABLE 2

| | Bonding conditions | | | | Evaluation | | | |
|---|---|---|---|---|---|---|---|---|
| | Pressing load (MPa) | Heating temperature (° C.) | Heating rate (° C./min) | Holding time (min) | Active metal compound layer | | Al concentration of region E (at %) | Ultrasonic wave bonding property |
| | | | | | Material | Crystallinity | | |
| Example 1 | 1.47 | 800 | 20 | 100 | Ti-O | Crystalline | 0.01 | A |
| Example 2 | 0.29 | 950 | 10 | 5 | Ti-O | Crystalline | 0.01 | A |
| Example 3 | 0.10 | 930 | 15 | 120 | Ti-O | Crystalline | 0.03 | A |
| Example 4 | 0.10 | 800 | 13 | 90 | Hf-O | Crystalline | 0.14 | A |
| Example 5 | 3.43 | 950 | 13 | 30 | Zr-O | Crystalline | 0.01 | A |
| Example 6 | 0.29 | 930 | 10 | 100 | Ti—N | Crystalline | 0.13 | A |
| Example 7 | 0.10 | 940 | 5 | 90 | Ti—N | Crystalline | 0.15 | A |
| Example 8 | 0.29 | 830 | 10 | 90 | Zr-O | Crystalline | 0.02 | A |
| Example 9 | 0.49 | 770 | 7 | 15 | Nb-O | Crystalline | 0.02 | A |
| Comparative Example1 | 0.10 | 690 | 13 | 180 | Ti-O | Amorphous | 0.01 | C |
| Comparative Example2 | 0.10 | 800 | 10 | 0 | Ti-O | Amorphous | 0.03 | C |
| Comparative Example3 | 0.10 | 930 | 10 | 150 | Ti—N | Crystalline | 0.41 | B |
| Comparative Example4 | 0.10 | 980 | 10 | 15 | Ti—N | Crystalline | 0.28 | B |

In Comparative Examples 1 and 2 in which the active metal compound layer was amorphous, peeling occurred at the bonded interface between the copper sheet and the ceramic substrate after the bonding with ultrasonic waves.

In Comparative Examples 3 and 4 in which the Al concentration in the region E in the bonding portion exceeded 0.15 at %, no peeling was observed at the bonded interface between the copper sheet and the ceramic substrate after the bonding with ultrasonic waves; however, peeling or ceramic cracking was confirmed as a result of performing an inspection with the ultrasonic flaw detector.

On the other hand, in Examples 1-9 of the present invention in which the active metal compound layer was crystalline and the Al concentration in the region E of the bonding portion was set to 0.15 at % or less, no peeling was observed at the bonded interface of the copper sheet and the ceramic substrate after ultrasonic wave bonding and neither peeling nor ceramic cracking was confirmed as a result of inspection using an ultrasonic flaw detector.

In addition, referring to FIG. 9, in Example 3 of the present invention, it was confirmed that a crystalline active metal compound layer (rutile-type Ti—O layer) was formed at the interface portion of the ceramic substrate.

Further, referring to FIG. 10, in Example 3 of the present invention, it was confirmed that the active metal concentration (Ti concentration) at the interface portion of the ceramic substrate was higher than in Comparative Example 1.

In addition, referring to FIG. 11, in Example 4 of the present invention, it was confirmed that a Si-concentrated layer was formed between the ceramic substrate formed of alumina and the crystalline active metal compound layer.

From the above, according to the Examples of the present invention, it was confirmed that it is possible to provide a bonded body which is able to suppress peeling of a ceramic member and a copper member even when bonding with ultrasonic waves is performed, and an insulated circuit board.

Example 2

Using the brazing material and active metal material shown in Table 3, copper sheets formed of oxygen-free copper (37 mm×37 mm×0.3 mm thickness) were sequentially laminated on both surfaces of a ceramic substrate (40 mm×40 mm×0.635 mm thickness) formed of the material shown in Table 3 to form a laminate.

Then, the laminate was put into a vacuum heating furnace in a state of being pressed with the load shown in Table 4 and heated to bond the respective copper sheets to both surfaces of the ceramic substrate. The heating temperature and time were as shown in Table 4.

As described above, the bonded bodies of the Examples of the present invention were obtained. For the obtained bonded bodies, the "Material and Crystallinity of Active Metal Compound Layer", the "Al Concentration in Region E of Bonding Layer", the "Thickness of Active Metal Compound Layer", and the "Thermal cycle Reliability" were evaluated. The "Material and Crystallinity of Active Metal Compound Layer" and the "Al Concentration in Region E of Bonding Layer" were evaluated in the same manner as in Example 1.

(Thickness of Active Metal Compound Layer)

Measurement was carried out using a transmission electron microscope (Titan ChemiSTEM, manufactured by FEI, accelerating voltage: 200 kV) at a magnification of 80,000 times to acquire element mapping of the N, O, and active metal element using the energy dispersive X-ray analysis method (NSS7 manufactured by Thermo Scientific). It was determined that an active metal compound layer was present in a case where the active metal element and N or O existed in the same region.

The observation was performed in five visual fields, and the average value obtained by dividing the area of the range where the active metal element and N or O existed in the same region by the measured width was defined as the "Thickness of Active Metal Compound Layer".

(Thermal Cycle Reliability)

Using a thermal shock tester (TSA-72ES manufactured by ESPEC CORP.), a thermal cycle of −50° C.×10 min↔175° C.×10 min in the gas phase was carried out for up to 250 cycles.

Every 10 cycles, the presence or absence of cracking in the ceramic substrate was determined by an interface inspection using an ultrasonic flaw detector (FineSAT200 manufactured by Hitachi Power Solutions Co., Ltd.).

TABLE 3

| | Ceramic substrate Material | Brazing material Material | Thickness (μm) | Active metal material Material | Thickness (μm) |
|---|---|---|---|---|---|
| Example 11 | AlN | Cu-6.3 mass % P-9.3 mass % Sn-7 mass % Ni | 25 | Ti | 0.5 |
| Example 12 | AlN | Cu-6.3 mass % P-9.3 mass % Sn-7 mass % Ni | 25 | Ti | 0.5 |
| Example 13 | AlN | Cu-6.3 mass % P-9.3 mass % Sn-7 mass % Ni | 25 | Ti | 0.5 |
| Example 14 | AlN | Cu-7 mass % P-15 mass % Sn2.5 mass % Cr | 25 | Zr | 0.5 |
| Example 15 | AlN | Cu-7 mass % P-15 mass % Sn2.5 mass % Cr | 25 | Zr | 0.5 |
| Example 16 | AlN | Cu-7 mass % P-15 mass % Sn2.5 mass % Cr | 25 | Zr | 0.5 |
| Example 17 | $Al_2O_3$ | Cu-7 mass % P-15 mass % Sn3 mass % Mn | 10 | Zr | 0.1 |
| Example 18 | $Al_2O_3$ | Cu-7 mass % P-15 mass % Sn3 mass % Mn | 10 | Zr | 0.1 |
| Example 19 | $Al_2O_3$ | Cu-7 mass % P-15 mass % Sn3 mass % Mn | 10 | Zr | 0.1 |

TABLE 4

| | Bonding conditions | | | | Evaluation | | | |
| --- | --- | --- | --- | --- | --- | --- | --- | --- |
| | Pressing | Heating | Heating | Holding | Active metal compound layer | | Al concentration | Ceramic cracking cycle |
| | load (MPa) | temperature (° C.) | rate (° C./min) | time (min) | Material | Crystallinity | Thickness (nm) | of region E (at %) | number (times) |
| Example 11 | 0.1 | 900 | 5 | 90 | Ti-O | Crystalline | 13.4 | 0.01 | >250 |
| Example 12 | 0.1 | 920 | 5 | 90 | Ti-O | Crystalline | 38.5 | 0.07 | 230 |
| Example 13 | 0.1 | 940 | 5 | 90 | Ti-O | Crystalline | 97.8 | 0.15 | 170 |
| Example 14 | 0.1 | 900 | 5 | 90 | Zr-O | Crystalline | 19.9 | 0.01 | 230 |
| Example 15 | 0.1 | 920 | 5 | 90 | Zr-O | Crystalline | 56.4 | 0.1 | 200 |
| Example 16 | 0.1 | 940 | 5 | 90 | Zr—N | Crystalline | 148.3 | 0.13 | 160 |
| Example 17 | 0.3 | 800 | 10 | 90 | Zr-O | Crystalline | 1.5 | 0.02 | >250 |
| Example 18 | 0.3 | 830 | 10 | 90 | Zr-O | Crystalline | 3.7 | 0.01 | >250 |
| Example 19 | 0.3 | 860 | 10 | 90 | Zr-O | Crystalline | 8.1 | 0.03 | >250 |

In Examples 11 to 19 of the present invention in which the thickness of the active metal compound layer was in the range of 1.5 nm or more and 150 nm or less, it was confirmed that the number of the thermal cycle at which ceramic cracking was generated was 160 or more and that the thermal cycle reliability was excellent. In particular, in Examples 11, 17, 18, and 19 of the present invention in which the thickness of the active metal compound layer was in the range of 1.5 nm or more and 15 nm or less, cracking of the ceramic substrate was not confirmed even after loading of 250 thermal cycles and it was confirmed that the thermal cycle reliability was particularly excellent.

From the above, in a case where greater thermal cycle reliability is required, the thickness of the active metal compound layer is preferably in a range of 1.5 nm or more and 150 nm or less, and more preferably in a range of 1.5 nm or more and 15 nm or less.

INDUSTRIAL APPLICABILITY

According to the present invention, it is possible to provide a bonded body which is able to suppress peeling of a ceramic member and a copper member even in a case where bonding with ultrasonic waves is performed, and an insulated circuit board.

REFERENCE SIGNS LIST 1, 101 Power module
3 Semiconductor element (electronic component)
10, 110 Insulated circuit board (bonded body)
11, 111 Ceramic substrate (ceramic member)
12, 112 Circuit layer
13, 113 Metal layer
22, 23, 122 Copper sheet (copper member)
30, 130 Bonding layer
31, 131 Active metal compound layer

What is claimed is:

1. A bonded body comprising a ceramic member and a copper member,
wherein the ceramic member comprises an Al-based ceramic and the copper member comprises copper or a copper alloy,
wherein, in a bonding layer formed between the ceramic member and the copper member, a crystalline active metal compound layer comprising a compound including an active metal is formed on a ceramic member side,
an Al concentration is greater than zero and 0.15 at % or less in a thickness range of 0.5 μm to 3 μm from an interface on a copper member side of the active metal compound layer toward the copper member,
a thickness of the active metal compound layer is in a range of 1.5 nm or more and 60 nm or less,
the ceramic member is formed of one of aluminum nitride and alumina,
the active metal compound layer is formed of a crystalline titanium compound, and
the crystalline titanium compound is titanium oxide or titanium nitride.

2. The bonded body according to claim 1,
wherein the active metal compound layer contains one of an active metal nitride and an active metal oxide.

3. An insulated circuit board provided with the bonded body according to claim 2, comprising:
a ceramic substrate, which is formed of the ceramic member; and
a circuit layer, which is formed of the copper member formed on one surface of the ceramic substrate.

4. An insulated circuit board provided with the bonded body according to claim 1, comprising:
a ceramic substrate, which is formed of the ceramic member; and
a circuit layer, which is formed of the copper member formed on one surface of the ceramic substrate.

5. The insulated circuit board according to claim 4,
wherein a metal layer is formed on a surface of the ceramic substrate on a side opposite to the circuit layer.

6. The insulated circuit board according to claim 5,
wherein the metal layer is formed of copper or a copper alloy.

7. The insulated circuit board according to claim 5,
wherein the metal layer is formed of aluminum or an aluminum alloy.

* * * * *